United States Patent [19]

Bauer et al.

[11] Patent Number: 4,602,835
[45] Date of Patent: Jul. 29, 1986

[54] EJECTION AND GROUNDING SYSTEM FOR RACK-MOUNTED PLUG-IN MODULES

[75] Inventors: Willi Bauer, Kraichtal; Otto Kessler, Woerth; Reinhard Schmitt, Hagenbach; Gerhard Wojtas, Karlsruhe, all of Fed. Rep. of Germany

[73] Assignee: Siemens Aktiengesellschaft, Berlin and Munich, Fed. Rep. of Germany

[21] Appl. No.: 623,700

[22] Filed: Jun. 22, 1984

[30] Foreign Application Priority Data

Jun. 24, 1983 [DE] Fed. Rep. of Germany ....... 3322856

[51] Int. Cl.$^4$ .......................................... H01R 13/62
[52] U.S. Cl. ............................... 339/45 M; 339/14 R; 339/75 MP
[58] Field of Search ........... 339/45, 75 MP, 14, 91 R, 339/17 LM, 17 M

[56] References Cited

U.S. PATENT DOCUMENTS

| 3,170,744 | 2/1965 | Farnsworth | 339/14 R |
| 3,423,719 | 1/1969 | Zaffrann et al. | 339/121 |
| 3,470,522 | 9/1969 | Lawrence | 339/14 R |
| 3,476,258 | 11/1968 | Dorsett | 211/41 |
| 3,853,379 | 12/1974 | Goodman et al. | 339/75 MP |
| 4,083,616 | 4/1978 | McNiece et al. | 339/45 M |
| 4,243,283 | 1/1981 | McSparran | 339/14 R |
| 4,381,878 | 5/1983 | Lechner et al. | 339/14 R |
| 4,421,372 | 12/1983 | Golden | 339/75 |
| 4,484,381 | 11/1984 | Ellis et al. | 339/75 MP |

FOREIGN PATENT DOCUMENTS

| 2740684 | 11/1978 | Fed. Rep. of Germany | 339/14 R |
| 2844576 | 4/1980 | Fed. Rep. of Germany | 339/14 R |

OTHER PUBLICATIONS

IBM Tech. Disclosure Bulletin, "Multipontact Plug with Improved Grounding, vol. 22, #6 (11/1979).

Primary Examiner—Gil Weidenfeld
Assistant Examiner—David L. Pirlot
Attorney, Agent, or Firm—Mark H. Jay

[57] ABSTRACT

An ejection and grounding system for rack-mounted plug-in modules includes an angle lever which bears against a frame element to extract a module mounted in a rack. The frame element contains an electrical buss means for grounding the modules. A bracket is attached to the module and grounds the module to the buss; the bracket also supports the angle lever so that it rotates parallel to the module.

2 Claims, 10 Drawing Figures

EJECTION AND GROUNDING SYSTEM FOR RACK-MOUNTED PLUG-IN MODULES

BACKGROUND OF THE INVENTION

The invention relates to systems for installing and removing plug-in modules into and from racks. In, for example, the computer industry it is known to mount groups of electronic components on one or more rigid printed circuit boards to form a module which can then be installed in a rack. It is also known to have the rear edge of the module support plug-in connectors or contacts, which become connected to the back wall of the rack when the module is fully inserted.

When the number of connectors is increased, the force required to join and separate the connectors also increases. Consequently, installation and removal of a module can become difficult.

Other requirements exist for systems of this type. One such requirement is that the module must be well grounded. This is because such modules are densely packed and parasitic signals may cause interference. Therefore, each module should be grounded using a low impedance and large area connection. Additionally, it is occasionally necessary to mount a connector on the front of a module, and this connector should likewise be well grounded. Additionally, it is sometimes advantageous to shield the entire front edge of a module.

Other requirements are that an unused rack section should be covered by a blank panel, and that a system of this type should be easily adaptable to modules of varying sizes.

One object of the invention is to provide an ejection and grounding system for rack-mounted plug-in modules which eases installation and removal of an individual module from the rack even if high forces must be applied to the module.

Another object is to provide such a system which provides an excellent ground connection for each module.

Yet another object is to provide such a system which can shield the front of each module after installation.

Yet a further object is to provide such a system in which a connector can easily be installed anywhere on the front of a module, and in which the connector will be well grounded.

A still further object is to provide such a system in which unused rack slots can be covered by blank panels.

Yet another object is to provide a system which can be easily adapted to differently sized modules.

Yet another object of the invention is to generally improve on known devices. Other objects and advantages will become apparent hereinafter.

SUMMARY OF THE INVENTION

In accordance with the invention, there is provided a fixed and elongated frame element which has an elongated recess that is open in front. The recess contains a groundable electrical buss means.

There is also provided an electrically conductive bracket which is adapted for physical and electrical connection to a module. The bracket has an electrically conductive prong for connection to the buss means. An angle lever is pivotally secured to the bracket and can be rotated parallel to the module. The lever is so located that it is urged against the frame to extract the module.

This construction ensures that each module is well grounded. It also ensures that the module is easy to remove, since the lever permits large forces to be conveniently applied to separate the module from the rack. Additionally, each individual module can be individually installed and removed without affecting any other module.

Advantageously, there are two parallel frame elements and each of the front corners of a module is attached to a bracket and lever assembly. An electrically conductive strip can be connected between the two brackets to shield the front of the module and also provide a support for any connector which is to be attached to the front of the module.

The invention will be better understood with reference to the following drawings and the detailed description of preferred embodiments.

BRIEF DESCRIPTION OF THE DRAWINGS

Exemplary and non-limiting preferred embodiments of the invention are shown in the drawings, in which.

DETAILED DESCRIPTION OF PREFERRED EMBODIMENTS

Figures 1, 8, 9:
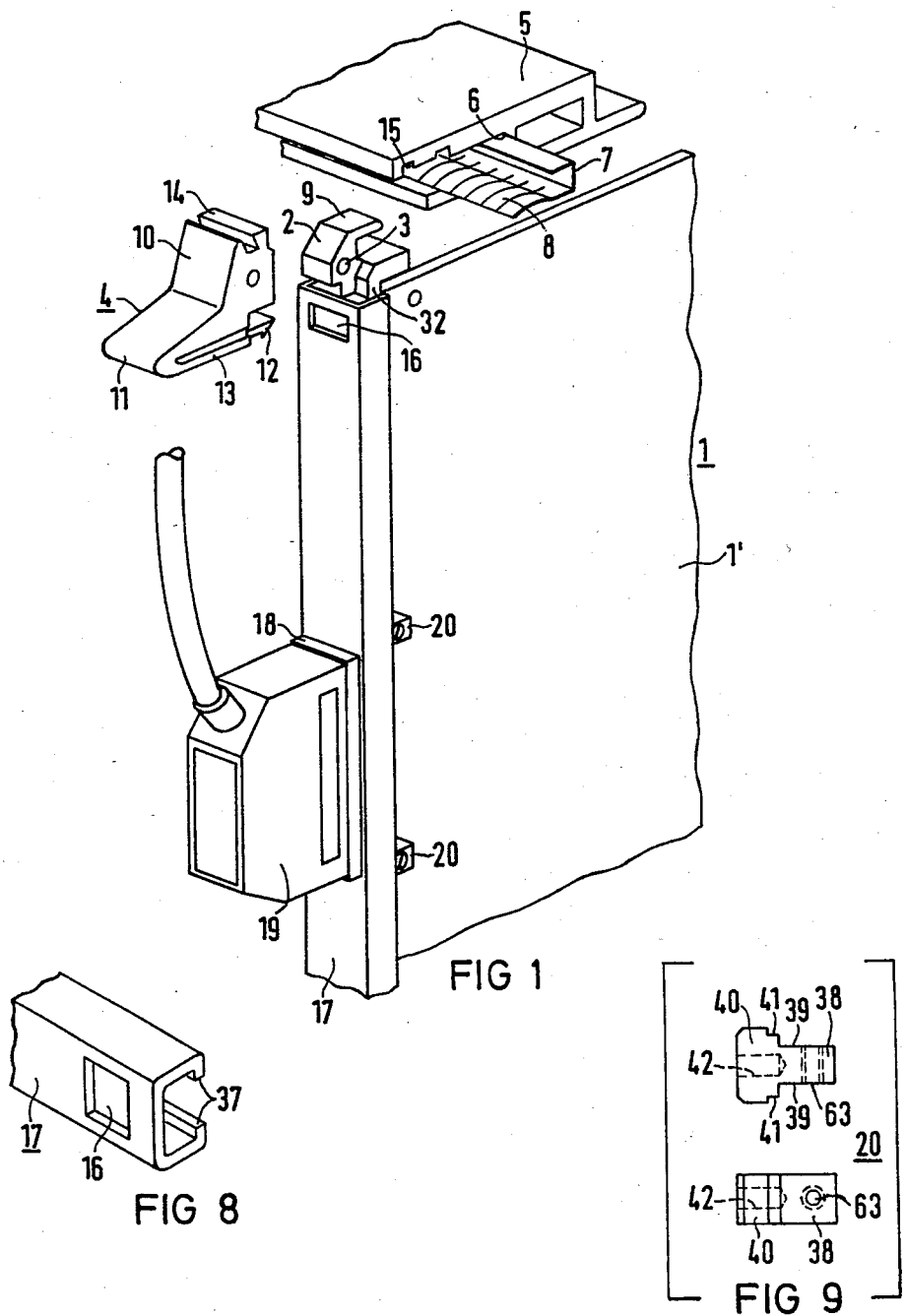
FIG. 1 is a partially exploded view of an embodiment of the invention.
FIG. 8 shows one end of a front strip which may be mounted on a module.
FIG. 9 shows a fitting which may be used to attach a front strip to a module.

The same element is always indicated by the same reference numeral in all the Figures.

FIG. 1 shows the front portion of a plug-in module 1. Module 1 consists essentially of a printed circuit board assembly 1' and has a bracket 2 at each of its front corners. The bracket 2 is electrically conductive and is connected to ground on module 1, and has a seat 3 for the axle of an angle lever 4. The lower front corner of the module 1 supports a like assembly, which is the mirror image of the assembly just described.

The module 1 has connectors (not shown) on its back side (not shown) and is inserted lengthwise into grooves 22 of supports 21 (see FIG. 2) of a module rack. The rack has two parallel and elongated frame elements 5 extending normal to the insertion plane of the modules 1. The frame elements 5 each contain a recess 6 which is open toward the front and that contains a leaf spring 7 with comb-like leaves 8. The spring 7 is an electrical buss which is used to ground the module 1.

Each of the brackets 2 has a basically rectangular profile formed by two slab-shaped legs, and is provided with a tongue 9, which extends parallel to the length of the module 1. In the inserted state of module 1 the tongue 9 comes in contact over a large surface of the leaves 8 to assure adequate grounding via a low impedance path.

An angle lever 4 is pivotally secured to the bracket 2 and rotates parallel to the module 1. The angle lever 4 is an integral unit which has a lever arm 11 and a lever arm 10. Lever arm 11 forms a handle from which extends a leaf spring 13 that has a latch 12 at its distal end. The lever arm 10 acts on the front of the frame element 5.

In this example, the end of the lever arm 10 has a tongue 14 which engages a groove 15. Groove 15 is formed on the inside of the outer leg of the frame element 5 and extends parallel to its front edge.

To lock the module 1 in the module rack, the latch 12 engages an opening 16 provided at each end of each front strip 17. The front strip 17 is electrically conductive and is attached to the module 1. The ends of the front strip 17 bear on the sectional legs 32 of the brackets 2, which extend along the front edge. The front strip 17 thus shields against electromagnetic interference because the front strip 17 is well grounded to the bracket 2. The front strip 17 may be provided at any desired points with bushings into which the connector 18 for a front plug 19 (or other element) can be inserted and connected to the module 1 in the usual manner.

Fittings 20 are grounded to attach the socket 18 for the front plug 19 to the module 1 and/or to prevent flexing and sagging of printed circuit board 1'. The fittings 20 are attached to the front edge of the module 1 and to the front strip 17 (see also FIG. 9).

Figure 2:
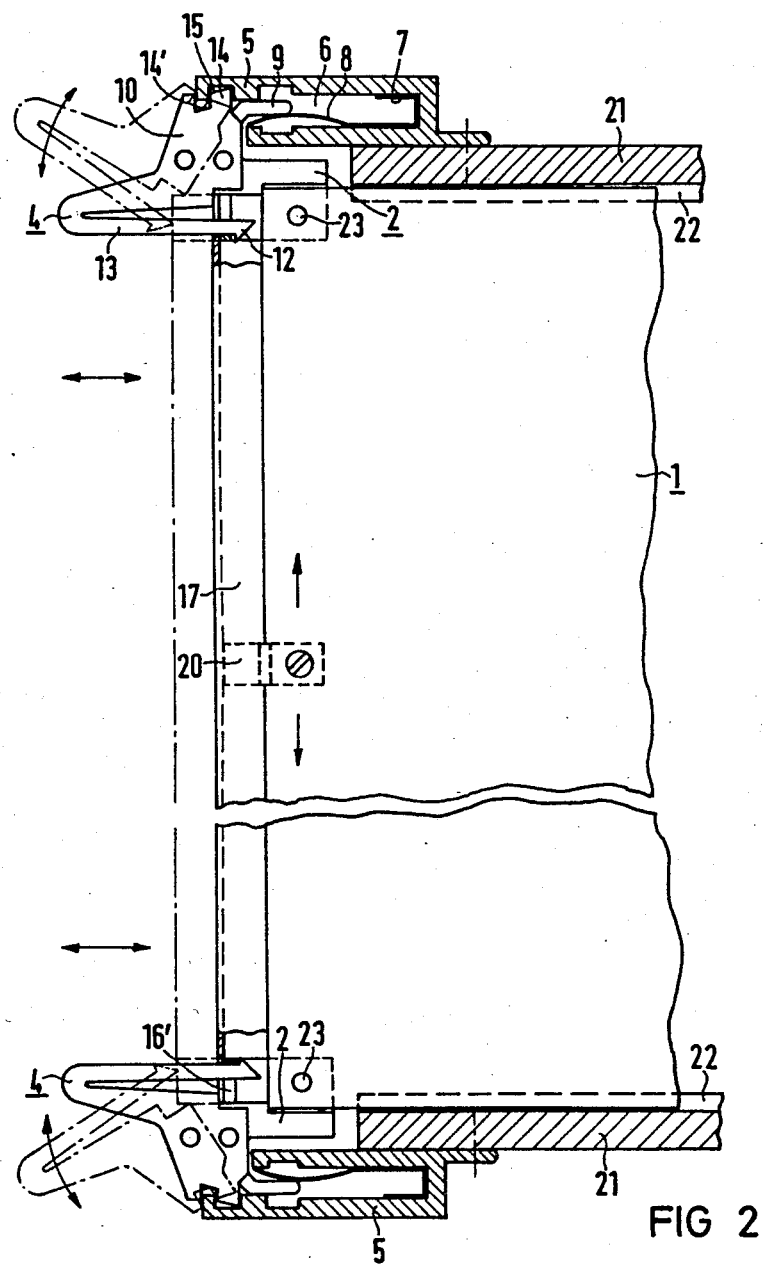
FIG. 2 is a side view of the embodiment of FIG. 1.

FIG. 2 shows a plug-in module 1, inserted longitudinally into guide grooves 22 of supports 21 of the module rack. The brackets 2 are connected over the front corners of the module 1 as by screws or nuts 23, such that the brackets 2 are connected over a large area to the ground lines of the module 1.

Tongues 9 are shown connected with the leaves 8 of the leaf springs 7 and are thus grounded to the frame elements 5.

The tongue 14 is shown engaged in groove 15, within the recess 6 of the frame element 5. The leaf spring 13 has its latch 12 locked in the bracket 2 behind the lower edge of an opening 16' (see also FIG. 6). This locks module 1 in the module rack and assures a low-impedance connection to ground.

To release the plug-in module 1 from its multi-pole plug connection (not shown here) with the backwall wiring in the module rack, the two angle levers 4 are swung outward by pressure applied to the underside of their lever arms 11. In so doing, the leaf springs 13 are pressed inward, to disengage the latches 12. At the same time, tongue 14 presses against the inner edge of groove 15, as tongue 14' presses on the end face of frame element 5. The module 1 is released and reaches the position shown in broken lines, from which it can easily be extracted from the rack.

The module 1 is plugged in by introducing it into the guide grooves 22 until the tongues 14 at the ends of the angle levers 4 enter the grooves 15 in the frame elements 5. When the outer surfaces of the lever arms 11 are pressed, the angle levers 4 pivot inwardly. The tongues are engaged by the inner faces of the grooves 15, and the plug connection is established by leverage, overcoming the considerable plugging forces. The latches 12 are then locked in the module 1.

With the aid of the angle levers 4, installation and removal of the modules 1—particularly modules 1 having several multi-pole connectors—is considerably facilitated.

For mechanical stiffening, any desired points on the front strip 17 can be connected by fittings 20 with the front edge of module 1. One end of each fitting 20 is connected with the module 1 by screwing or otherwise, while the other end is held inside the front strip 17 (see FIGS. 8 and 9) in such a manner as to be slidable with the front strip 17 but otherwise constrained to stay within it.

Figure 3:
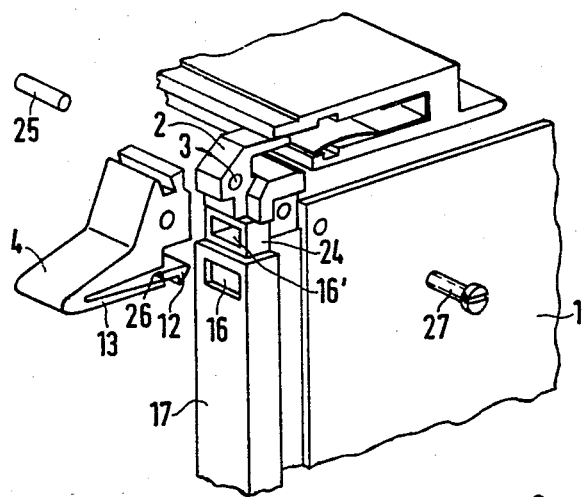
FIG. 3 is an exploded detail view of an embodiment with a front strip.

FIG. 3 shows the connection of the front strip 17 with the bracket 2, corresponding to FIG. 2. The bracket 2 is provided with a frame-shaped extension 24 extending parallel to the front plane, and having on the front side a window-like opening 16', the lower edge of which is formed as the retaining edge for the latch 12. The extension 24 is dimensioned so that the end of front strip 17 (which is made of electrically conductive U-section material) can be slipped over it, so that the opening 16 in the front strip 17 coincides with the opening 16' in extension 24. The leaf spring 13 has shoulder type offsets 26 on each side. When an angle lever is locked, the offsets bear against the outer face of front strip 17 adjacent opening 16.

Figure 4:
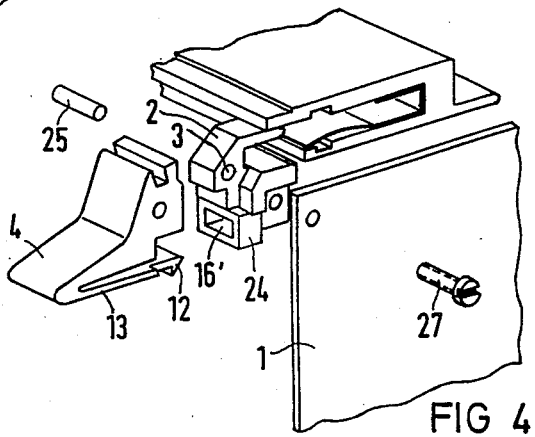
FIG. 4 is an exploded detail view of an embodiment without a front strip.

If front shielding is not required, the front strip 17 may, as FIG. 4 shows, be omitted. The operation of the angle lever 4 is not thereby impaired. The front corners of the module 1 are connected with bearing surfaces of the brackets 2 as by screws 27. For locking, latch 12 snaps into the opening 16' in the extension 24 of the bracket 2.

Figure 5:
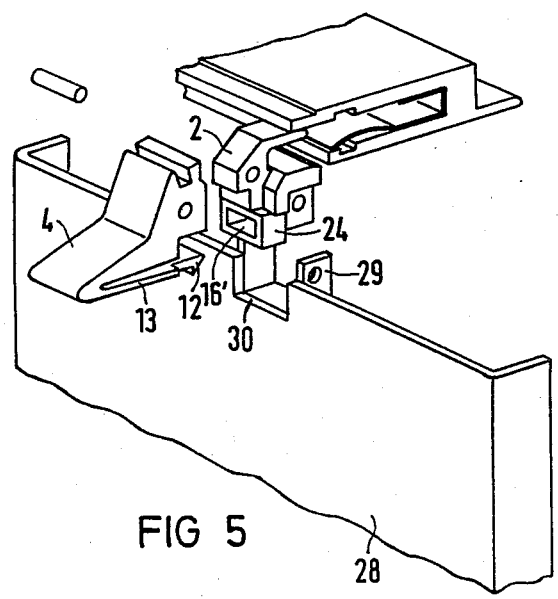
FIG. 5 shows another embodiment of the invention.

If modules with a relatively large front area or with a space left free must be covered over in the rack on the front, this can be done with one or more blank panels 28, as FIG. 5 shows. The locking system, consisting of the brackets 2 and angle levers 4, can be employed here also, in that the blank panel 28 is connected with the bracket 2 by means of a fishplate 29 attached to its back.

In the center of the upper and lower edges of panel 28 a cut-out 30 is provided, into which fits the frame type extension 24 of the bracket 2, so that the latch 12 of the leaf spring 13 can enter the opening 16' and can snap into it. Another possibility is to use the bracket 2 without the extension 24 and to form the upper edge of panel 28 in such a way that the latch 12 can snap in behind it.

Figure 6:
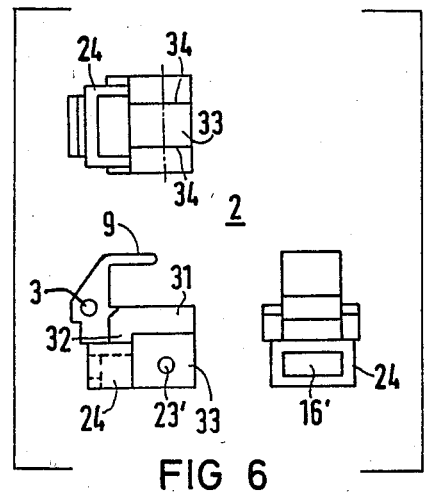
FIG. 6 shows a preferred construction of the bracket of the invention.

FIG. 6 shows a preferred form of the bracket 2 in three views. It consists essentially of an angle section with one long leg 31 and one shorter leg 32 which terminates at the bottom in the frame-like extension 24 with the opening 16'. Between legs 31 and 32 extends a plate-shaped extension 33, which has a bore 23' extending parallel to the axle hole 3, and two contact surfaces 34 parallel to the slide-in plane. Bore 23' is for receiving a screw or rivet connection.

To prevent electromagnetic interference, wide conductor tracks 35 are provided along the edges of printed board assemblies 1' of plug-in modules 1. The conductor tracks 35 are grounded.

Figure 7:
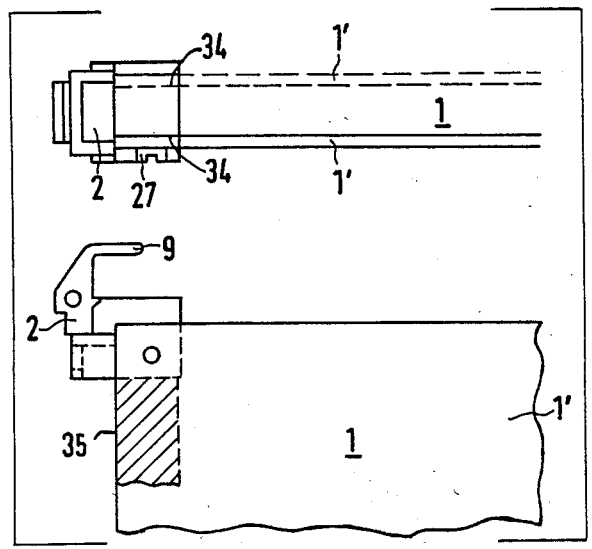
FIG. 7 shows a preferred attachment of the bracket to a module.

As shown in FIG. 7, one or more of the circuit boards 1' can be connected over a large area with the contact surfaces 34 of a bracket as by means of screw 27. The conductor tracks 35 can thus be grounded with low impedance.

In the example shown in FIG. 8, the front strip 17 is shown as a U-shaped hollow section with flanges 37. The front strip 17 may in this case be of very light construction, as it does not carry plug-in or operating parts and merely protects against disturbing mechanical or electrical effects.

The fitting 20 shown in two views in FIG. 9, (as already shown in FIGS. 1 and 2) serves to connect module 1 or respectively the circuit board 1' thereof with the front strip 17 and/or the socket 18 of a front plug 19. The fitting 20 has a slab-shaped part 38 which, as in the case of the bracket 2 (FIG. 6), has bearing surfaces 39 and a bore 63 for rivet or screw connection with the front edge of the module 1 or with the circuit board(s) 1' thereof. The head 40 of fitting 20 is enlarged and can slide into the cavity of the front strip 17, the flanges 37 of front strip 17 engaging behind corresponding edges 41 on the backwall of head 40. Fitting 20 can slide to any desired position inside front strip 17.

From its end face, the fitting 20 may be provided with means for mating with mounting hardware, such as a threaded hole 42 for attachment screws of component attached on the front strip 17, particularly sockets for front plugs.

Figure 10:
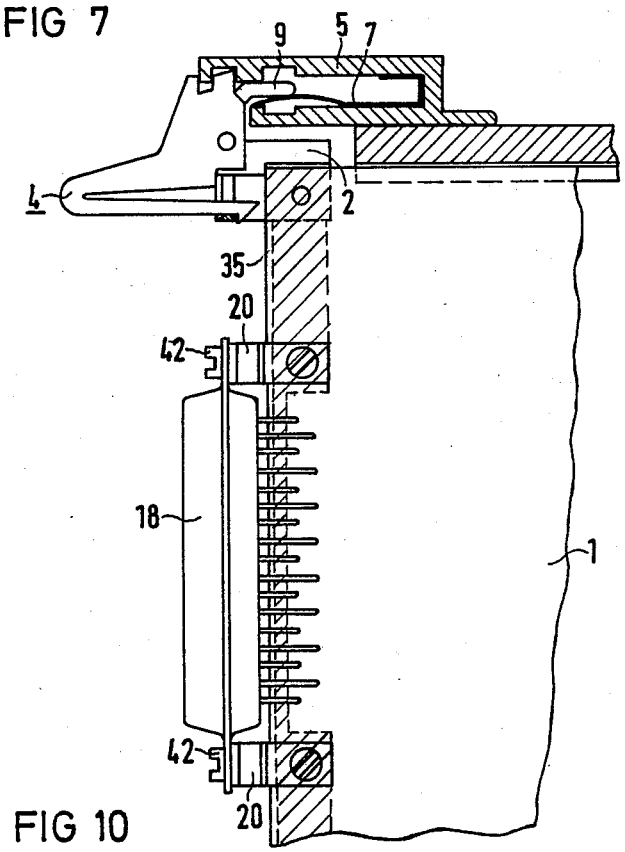
FIG. 10 illustrates another embodiment of the invention in which a connector is mounted to the module without using a front strip.

FIG. 10 illustrates remounting of a plug socket 18 for front plugs at the front edge of module 1. The fittings 20, made from conductive material or with a conductive surface, are screwed to the front edge of module 1 and contact the conductor track 35 for grounding. The plug socket 18 (or respectively its metal housing) is connected with the fittings 20 by fastening screws 42'. When plugging in a front plug 19, the shielding thereof is connected to the frame element 5, by way of the plug socket 18, fittings 20, conductor track 35, bracket 2, contact surface 9 thereof and the leaf spring 7. As can be seen, this arrangement can be used with or without the front strip 17.

Those skilled in the art will understand that changes can be made in the preferred embodiments here described, and that these embodiments can be used for other purposes. Such changes and uses are within the scope of the invention, which is limited only by the claims which follow.

What is claimed is:

1. An ejection and grounding system for rack-mounted plug in modules comprising:
   a fixed and elongated frame element having an elongated recess that is open in front;
   a groundable electrical buss means located in the recess;
   an electrically conductive bracket adapted for physical and electrical connection to a rack-mounted plug-in module, the bracket having an electrically conductive prong for electrical contact with the buss means;
   an angle lever pivotally secured to the bracket and rotatable parallel to the module, the lever being urged against the frame element to extract the module; and
   means for locking the angle lever in a position, said locking means comprising a leaf spring attached to the angle lever, the leaf spring being detachably securable to a component which is fixed to the plug-in module.

2. The system of claim 1, wherein the leaf spring is integrated with the angle lever.

* * * * *